(12) United States Patent
Leidel

(10) Patent No.: US 11,693,576 B2
(45) Date of Patent: *Jul. 4, 2023

(54) APPARATUSES AND METHODS FOR MEMORY ALIGNMENT

(71) Applicant: Micron Technology, Inc., Boise, ID (US)

(72) Inventor: John D. Leidel, McKinney, TX (US)

(73) Assignee: Micron Technology, Inc., Boise, ID (US)

(*) Notice: Subject to any disclaimer, the term of this patent is extended or adjusted under 35 U.S.C. 154(b) by 66 days.

This patent is subject to a terminal disclaimer.

(21) Appl. No.: 17/360,533

(22) Filed: Jun. 28, 2021

(65) Prior Publication Data

US 2021/0326056 A1 Oct. 21, 2021

Related U.S. Application Data

(60) Continuation of application No. 16/574,847, filed on Sep. 18, 2019, now Pat. No. 11,048,428, which is a
(Continued)

(51) Int. Cl.
*G06F 3/06* (2006.01)
*G06F 12/10* (2016.01)
(Continued)

(52) U.S. Cl.
CPC .......... *G06F 3/0647* (2013.01); *G06F 3/061* (2013.01); *G06F 3/0619* (2013.01);
(Continued)

(58) Field of Classification Search
CPC ...... G06F 12/10; G06F 12/023; G06F 3/0647; G06F 3/061; G06F 3/0683; G06F 3/0619; G11C 7/1006; G11C 7/1012
See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Tracy A Warren
(74) *Attorney, Agent, or Firm* — Brooks, Cameron & Huebsch, PLLC

(57) ABSTRACT

The present disclosure includes apparatuses and methods related to memory alignment. An example method comprises performing an alignment operation on a first byte-based memory element and a second byte-based memory element such that a padding bit of the first byte-based memory element is logically adjacent to a padding bit of the second byte-based memory element and a data bit of the first byte-based memory element is logically adjacent to a data bit of the second byte-based memory element.

20 Claims, 4 Drawing Sheets

Related U.S. Application Data division of application No. 15/349,492, filed on Nov. 11, 2016, now Pat. No. 10,423,353.

(51) Int. Cl.
*G06F 12/02* (2006.01)
*G11C 7/10* (2006.01)

(52) U.S. Cl.
CPC ............ *G06F 3/0683* (2013.01); *G06F 12/10* (2013.01); *G11C 7/1006* (2013.01); *G06F 12/023* (2013.01); *G11C 7/1012* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,599,613 B1 | 7/2003 | Kasahara et al. |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |

(56) References Cited

U.S. PATENT DOCUMENTS

| | | |
|---|---|---|
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,478,312 B1 | 10/2016 | Kelso |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0140000 A1 | 10/2002 | Watanabe et al. |
| 2003/0014588 A1 | 1/2003 | Hu et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0071583 A1 | 3/2005 | Shepherd |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0233767 A1 | 10/2007 | Anderson |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0028189 A1 | 1/2008 | Hoogerbrugge |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0179242 A1 | 7/2011 | Ingle et al. |
| 2011/0219260 A1 | 9/2011 | Nobunaga et al. |
| 2011/0264819 A1 | 10/2011 | Srinivasan et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0151820 A1 | 6/2013 | Arekapudi et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0006809 A1 | 1/2015 | Harizopoulos et al. |
| 2015/0029798 A1 | 1/2015 | Manning |
| 2015/0042380 A1 | 2/2015 | Manning |
| 2015/0046644 A1 | 2/2015 | Karp |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |

(56) References Cited

U.S. PATENT DOCUMENTS

| | | |
|---|---|---|
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2005066792 | 7/2005 |
| WO | 2010079451 | 7/2010 |
| WO | 2013062596 | 5/2013 |
| WO | 2013081588 | 6/2013 |
| WO | 2013095592 | 6/2013 |
| WO | 2013130108 | 9/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
International Search Report and Written Opinion for related PCT Application No. PCT/US2017/059659, dated Feb. 5, 2018, 14 pages.
Extended European Search Report and Written Opinion for related EP Application No. 17869496.4, dated May 26, 2020, 7 pages.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

APPARATUSES AND METHODS FOR MEMORY ALIGNMENT

PRIORITY INFORMATION

This application is a Divisional of U.S. application Ser. No. 16/574,847, filed Sep. 18, 2019, which issues as U.S. Pat. No. 11,048,428 on Jun. 29, 2021, which is a Continuation of U.S. application Ser. No. 15/349,492 on Nov. 11, 2016, which issued as U.S. Pat. No. 10,423,353 on Sep. 24, 2019, the contents of which are included herein by reference.

TECHNICAL FIELD

The present disclosure relates generally to semiconductor memory and methods, and more particularly, to apparatuses and methods related to memory alignment.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processor may be implemented internal and/or near to a memory (e.g., directly on a same chip as the memory array), which may reduce time in processing and may also conserve power. Data movement between and within arrays and/or subarrays of various memory devices, such as processing-in-memory devices, can affect processing time and/or power consumption.

DETAILED DESCRIPTION

Figure 1A:
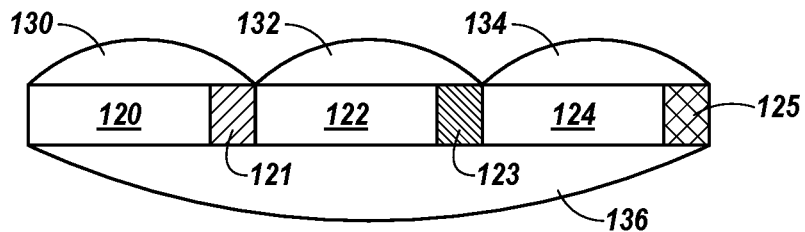
FIGS. 1A-1C are schematic diagrams illustrating a process of realigning a memory allocation having a byte-based alignment to a memory allocation having a non-byte-based alignment in accordance with a number of embodiments of the present disclosure.

A number of embodiments include a method for aligning byte-based memory elements so that data bits corresponding to data values are logically adjacent prior to performing logical operations on the data values.

In some approaches to aligning memory, architectures and operating systems (OS) may export byte-based addressing constructs in an instruction set architecture (ISA) and an application binary interface (ABI). If a memory element is defined to have a quantity of data bits corresponding to a data value where the bit length of the memory element does not equal an integer quantity of bytes, then an OS may pad out the memory element by adding bits to the memory element such that the bit length is equal to an integer number of bytes. Thus, memory requests may be made based on byte-based alignment. However, in an expressive memory device, such as a PIM device, it can be useful to operate on data in a non-byte-based alignment. Such a non-byte-based alignment can improve overall processing performance and lessen data movement requirements. Additionally, a non-byte-based alignment can allow optimizing compilers and runtime systems to generate instructions to align data bits of non-byte-based aligned memory elements for subsequent arithmetic, logical, and combinatorial operations. Such operations can be performed internal to the memory while a host maintains a byte-based alignment of memory elements. According to a number of embodiments of the present disclosure, programmers can construct portable code for heterogeneous architectures using language extensions that a C or C++ compliant compiler may understand.

Embodiments disclosed herein can include a methodology that can utilize byte-based alignment combined with a series of arithmetic, shift, and/or rotate operations to align byte-based memory elements on their respective bit-addressing boundaries.

A number of embodiments of the present disclosure can provide improved parallelism, increased speed, and/or reduced power consumption in association with performing data movement operations as compared to some previous approaches such as previous PIM devices and systems having an external processor (e.g., a processing resource located external from a memory array, such as on a separate integrated circuit chip). For example, a number of embodiments can provide for moving data on a shift register while performing compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as compare, destroy, etc.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

The term "alignment operation" refers to an operation capable of moving bits within a memory allocation. Examples of alignment operations include shift operations and rotate operations. According to the present disclosure, a rotate operation can be performed on bits stored in an array of memory cells such that the bits remain on chip during the rotate operation.

A rotate operation of a byte-based memory element can move at least the most significant bit (MSB) or at least the least significant bit (LSB) from one end of the byte-based memory element to the other, as if the ends of the byte-based memory element are coupled together. The rotate operation can also move other bits of the byte-based memory element over so that at least the MSB or LSB can be moved to the other end. Thus, the rotate operation includes a shift operation for the "other bits" and includes a copy operation, a shift operation, and a copy-back operation for at least the MSB or LSB, as described in more detail below. A rotate operation can be described in terms of an orientation of the rotate operation (e.g., rotate left operation or rotate right operation). For example, a rotate left operation can include moving a bit logically located at the left end (e.g., the MSB or LSB) of a byte-based memory element to the right end of the byte-based memory element and shifting the remaining bits to the left. As an example, if a byte-based memory element that is one byte (e.g., eight bits) long is rotated left by two bits, then the two leftmost bits of the byte-based memory element become the two rightmost bits of the byte-based memory element. The remaining six bits are shifted to the left by two bits such that the byte-based memory element occupies the same logical space. In contrast, a rotate right operation can include moving a bit logically located at the right end (e.g., the MSB or LSB) of a byte-based memory element to the left end of the byte-based memory element and shifting the remaining bits to the right.

Performing a shift operation on a one byte long byte-based memory element by two bits to the left would result in the two leftmost bits being overwritten by the two bits logically adjacent thereto. The shift operation would also result in the two rightmost bits either remaining the same or being overwritten with other data. A benefit of performing a rotate operation can be that information is not lost because the bits are moved and not overwritten as they would otherwise be in a shift operation.

Figure 1B:
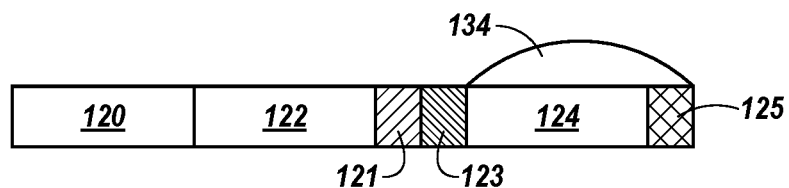
Figure 1C:
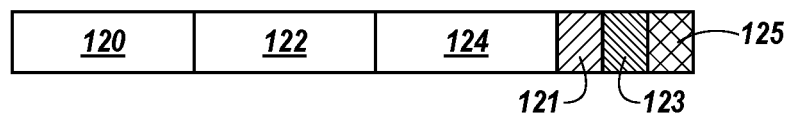

FIGS. 1A-1C are schematic diagrams illustrating a process of realigning a memory allocation having a byte-based alignment to a memory allocation having a non-byte-based alignment in accordance with a number of embodiments of the present disclosure. FIG. 1A illustrates the memory allocation having the byte-based alignment. FIG. 1B illustrates an intermediate step in the process of realigning the memory allocation. FIG. 1C illustrates the memory allocation having the non-byte-based alignment.

FIG. 1A includes a first byte-based memory element 130 comprising a data portion 120 ("the first data portion 120") and a padding portion 121 ("the first padding portion 121"), a second byte-based memory element 132 comprising a data portion 122 ("the second data portion 122") and a padding portion 123 ("the second padding portion 123"), and a third byte-based memory element 134 comprising a data portion 124 ("the third data portion 124") and a padding portion 125 ("the third padding portion 125"). The term "data portion" refers to one or more data bits, which are bits corresponding to data values. The term "padding portion" refers to one or more padding bits, which are bits inserted into a memory element to supplement the data bits in the memory element such that the total quantity of bits (data and padding) in the memory element is equal to an integer number of bytes.

FIG. 1A shows the byte-based memory elements 130, 132, and 134 as being back-padded such that the padding portions 121, 123, and 125 are logically to the right of their respective data portions 120, 122, and 124. The byte-based memory elements 130, 132, and 134 can also be front-padded, as opposed to being back-padded, such that the padding portions 121, 123, and 125 are logically to the left of their respective data portions 120, 122, and 124. Together the first, second, and third byte-based memory elements 130, 132, and 134 can comprise a memory allocation 136. The byte-based memory elements of a memory allocation, such as byte-based memory elements 130, 132, and 134, can be homogeneous such that each of the byte-based memory elements comprises the same quantity of data bits and the same quantity of padding bits. However, byte-based memory elements of a different allocation can have a different quantity of data bits and/or padding bits.

FIG. 1B shows the intermediate step in the process of realigning the memory allocation 136. After a rotate left operation on the first padding portion 121 and the first data portion 122, a padding bit of the first padding portion 121 that was logically adjacent to a data bit of the second data portion 122 is now logically adjacent to a padding bit of the second padding portion 123. The second data portion 122 has been shifted to the left such that the data bit of the second data portion 122 is now logically adjacent to a data bit of the first data portion 120. The second data portion 122 has been shifted to the left by a quantity of bits equal to the quantity of bits of the first padding portion 121. As used herein, "logically adjacent" refers to the conceptual position of a bit relative to another bit such that the two bits are positioned side-by-side. Physically, two bits that are logically adjacent are stored in two memory cells of an array that are physically adjacent to each other.

FIG. 1C illustrates the memory allocation 136 having the non-byte-based alignment. After a rotate left operation on the first padding portion 121, the second padding portion 123, and the third data portion 124, a padding bit of the second padding portion 123 that was logically adjacent to a data bit of the third data portion 124 is now logically adjacent to a padding bit of the third padding portion 125. The padding bits of the first padding portion 121 and the second padding portion 123 that were logically adjacent remain logically adjacent. The third data portion 124 has been shifted to the left by a different quantity of bits equal to a sum of the quantity of bits of the first padding portion 121 and the quantity of bits of the second padding portion 123. Thus, the data bit of the third data portion 124 is now logically adjacent to a data bit of the second data portion 122.

Although three byte-based memory elements are shown in FIGS. 1A-1C, the memory allocation 136 can comprise any number of byte-based memory elements. For example, the number of byte-based memory elements can be a user-defined length of the memory allocation 136. In some embodiments, the number of byte-based memory elements in a memory allocation can be defined by a number of data bits to be operated on simultaneously within the memory device. For example, if each byte-based memory element includes 30 data bits, and the memory device operates on 150 bits at a time, then the memory allocation can include five byte-based memory elements. In a memory allocation 136 comprising more than three byte-based memory elements, additional rotate operations can be performed in the series of rotate operations until all of the data bits of the memory allocation 136 are logically adjacent to each other and all of the padding bits of the memory allocation 136 are logically adjacent to each other.

A non-byte-based alignment can be useful on a PIM device because the PIM device can be configured to perform logical operations on an amount of data that is not an integer number of bytes. The PIM device may operate on the data more efficiently if the data is stored in physically adjacent memory cells (e.g., without having to deal with padding bits separating data bits). Thus, logical operations can be performed on only the data bits of the byte-based memory elements. Therefore, according to a number of embodiments of the present disclosure, prior to a logical operation, a process of realigning a memory allocation having a byte-based alignment to a memory allocation having a non-byte-based alignment can be performed. Following the logical operation, a process of realigning a memory allocation having a non-byte-based alignment to a memory allocation having a byte-based alignment can be performed (e.g., the above-described process with respect to FIGS. 1A-1C can be reversed). That is, the memory allocation can be returned to the byte-based alignment, although the values of the data bits may have changed according to the logical operation.

In order to minimize a quantity of rotate operations used to realign a memory allocation (or portion thereof) from a byte-based alignment to a memory allocation (or portion thereof) having a non-byte-based alignment, a series of rotate left operations can be used in response to the memory elements being back-padded or a series of rotate right operations can be used in response to memory elements being front-padded. The correspondence between rotate operation direction and front- or back-padding of a memory allocation allows one fewer rotate operations to be performed (versus the alternative) because the padding portion of the last memory element are already at the end of the memory allocation. For example, in FIGS. 1A-1C the third padding portion 125 was not operated on because the third padding portion 125 was already at the end of the memory allocation 136.

A methodology for memory element alignment in accordance with a number of embodiments of the present disclosure can be expressed mathematically. For a given memory allocation, each data portion can include a same quantity of data bits (b), which is not equal to an integer quantity of bytes. Padding bits can be added to the data bits so that a total quantity of bits (B) in a byte-based memory element is equal to an integer quantity of bytes. The total quantity of bits (B) therefore includes data bits and padding bits. The quantity of padding bits added to the non-byte based memory element can be the fewest needed such that B is an integer number of bytes. For example, if b is thirty bits, then two padding bits can be added so that B is thirty-two bits. The memory elements that are subject to an alignment operation can be numbered sequentially, starting with zero, where N represents the number assigned to a memory element.

Referring back to FIGS. 1A-1C, assume that the data portions 120, 122, and 124 each represent thirty data bits (b=30) and that the padding portions 121, 123, and 125 each represent two padding bits (B=32). Also assume that the byte-based memory elements 130, 132, and 134 are sequentially numbered beginning with byte-based memory element 130 ($N_{130}$=0; $N_{132}$=1; $N_{134}$=2). A quantity of bits by which the data portion of a corresponding memory element (N) should be shifted as part of a rotate operation to achieve a non-byte-based alignment can be expressed as $Q_N$, wherein:

$$Q_N = (B - b) \times N \qquad (1)$$

With reference to FIG. 1A, for the first data portion 120 of the first byte-based memory element 130 ($Q_{N_{130}}$=0); for the second data portion 122 of the second byte-based memory element 132 ($Q_{N_{132}}$=2); and for the third data portion 124 of the third byte-based memory element 134 ($Q_{N_{134}}$=4). To achieve the memory element alignment illustrated in FIG. 1B, the second data portion 122 can be shifted left as part of a first rotate left operation by two bits. To achieve the memory element alignment illustrated in FIG. 1C, the third data portion 124 can be shifted left as part of a second rotate left operation by four bits. Although FIGS. 1A-1C illustrate an example including three byte-based memory elements, embodiments are not so limited, as expression (1) can be used for any number of byte-based memory elements.

Figure 2:
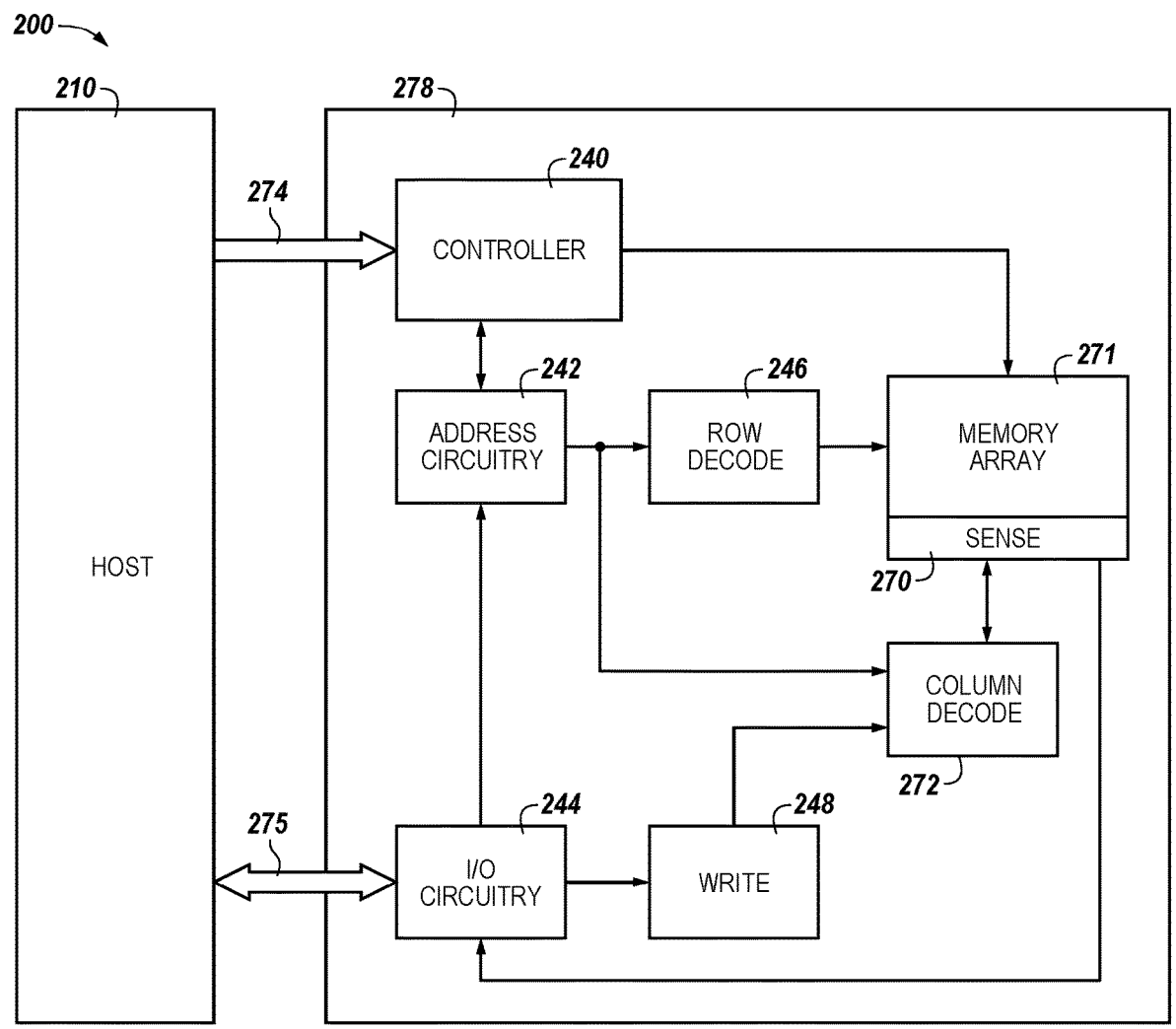
FIG. 2 is a block diagram of an apparatus in the form of a computing system including a memory device in accordance with a number of embodiments of the present disclosure.

A method for memory alignment in accordance with a number of embodiments of the present disclosure can include receiving, from a host (which can be analogous to the host 210 illustrated in FIG. 2), a logical address for data of a byte-based memory element of a memory allocation including a plurality of byte-based memory elements, translating the logical address to a physical address, and performing a logical operation, via sensing circuitry (which can be analogous to the sensing circuitry 270 illustrated in FIG. 2), on the data at the physical address. As used herein, "logical address" refers to a byte-based address whereas "physical address" refers to a bit-based address that corresponds to a particular memory cell. The logical address can be translated to the physical address based on a quantity of data bits of each of the plurality of byte-based memory elements, a quantity of padding bits of each of the plurality of byte-based memory elements, and a quantity of byte-based memory elements from a start of the memory allocation to the logical address.

Translating the logical address can include adjusting the logical address by a value equivalent to the quantity of padding bits multiplied by the quantity of byte-based memory elements from the start of the memory allocation to the logical address. After performing the logical operation, the data can be padded with the quantity of padding bits and the padded data can be sent to the host. The memory allocation can be defined at run time. Defining the memory allocation can include receiving a user-defined quantity of data bits in each of the byte-based memory elements of the memory allocation. Defining the memory allocation can include receiving a user-defined length of the memory allocation.

FIG. 2 is a block diagram of an apparatus in the form of a computing system 200 including a memory device 278 in accordance with a number of embodiments of the present disclosure. As used herein, a memory device 278, memory array 271, and/or sensing circuitry 270 can also be separately considered an "apparatus."

The computing system 200 includes a host 210 coupled (e.g., connected) to the memory device 278, which includes a memory array 271. The host 210 can be a host system such as a personal laptop computer, a desktop computer, a digital camera, a smart phone, or a memory card reader, among various other types of hosts. The host 210 can include a system motherboard and/or backplane and can include a number of processing resources (e.g., one or more processors, microprocessors, or some other type of controlling circuitry). The system 200 can include separate integrated circuits or both the host 210 and the memory device 278 can be on the same integrated circuit. The system 200 can be, for instance, a server system and/or a high performance computing (HPC) system and/or a portion thereof. Although the example shown in FIG. 2 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 200 has been simplified to focus on features with particular relevance to the present disclosure. The memory array 271 can be a hybrid memory cube (HMC), computational memory such as a processing in memory random access memory (PIMRAM) array, which can include one or more of a DRAM array, SRAM array, STT RAM array, PCRAM array, TRAM array, RRAM array, NAND flash array, and/or NOR flash array, for instance. The memory array 271 can comprise memory cells arranged in rows coupled by access lines, which may be referred to herein as word lines or select lines, and columns coupled by sense lines, which may be referred to herein as data lines or digit lines. Although a single memory array 271 is shown in FIG. 2, embodiments are not so limited. For instance, the memory device 278 may include a number of memory arrays 271 (e.g., a number of banks of DRAM cells, NAND flash cells, etc.).

The memory device 278 can include address circuitry 242 to latch address signals provided over an input/output "I/O" bus 275 (e.g., data bus and/or address bus) through I/O circuitry 244 (e.g., provided to external ALU circuitry and to DRAM DQs via local I/O lines and global I/O lines). Address signals can be received and decoded by a row decoder 246 and a column decoder 272 to access the memory array 271. Data can be read from the memory array 271 by sensing voltage and/or current changes on the sense lines using sensing circuitry 270. The sensing circuitry 270 can read and latch a page (e.g., row) of data from the memory array 271. The I/O circuitry 240 can be used for bi-directional data communication with host 210 over the I/O bus 275. The write circuitry 248 can be used to write data to the memory device 278. The controller 240 decodes signals provided by a control bus 274 from the host 210. These signals can include chip enable signals, write enable signals, and address latch signals that are used to control operations performed on the memory array 271, including data read, data write, and data erase operations. In various embodiments, the controller 240 is responsible for executing instructions from the host 210 and sequencing access to the memory array 271. The controller 240 can be a state machine (e.g., hardware and/or firmware in the form of an application specific integrated circuit (ASIC)), a sequencer, or some other type of controller. The controller 240 can control, for example generation of clock signals by controlling a location and/or time at which clock signals are initiated. For example, as described in more detail herein, the controller 240 can be in communication with a shift register, which may comprise a number of sense amplifiers and/or compute components to provide clock signals to shift data.

The sensing circuitry 270 can be formed on pitch with the sense lines of the memory array 271. For example, the cells of memory array may have a particular cell size (e.g., $4F^2$ or $6F^2$, where "F" is a feature size corresponding to the cells). In a number of embodiments, sensing components (e.g., respective sense amplifier and compute component pairs) corresponding to the sensing circuitry 270 are formed on a same pitch as sense lines of the array and can be operated to perform various compute functions. For instance, if the sense line pitch is 3F, the transistors of the sensing components can fit within the same 3F pitch. In contrast, the devices (e.g., logic gates) associated with ALU circuitry of various PIM systems may not be capable of being formed on pitch with the sense lines, which can increase chip size and/or memory density as compared to a number of embodiments of the present disclosure, for example.

As such, in a number of embodiments, circuitry external to the memory array 271 and sensing circuitry 270 is not needed to perform compute functions as the sensing circuitry 270 can perform the appropriate logical operations to perform such compute functions without the use of an external processing resource. In a number of embodiments, the sensing circuitry 270 can be operated as a number of 1-bit processing resources, with the sensing components coupled to respective columns of the memory array 271 serving as respective 1-bit processing elements. Therefore, the sensing circuitry 270 may be used to complement and/or to replace, at least to some extent, an external processing resource such as ALU circuitry of the host 210.

An embodiment in accordance with the present disclosure can comprise performing the process of realigning a memory allocation having a byte-based alignment to a memory allocation having a non-byte-based alignment described with respect to FIGS. 1A-1C via an apparatus comprising an array of memory cells, which can be analogous to the memory array 271 as illustrated in FIG. 2, sensing circuitry coupled to the array, which can be analogous to the sensing circuitry 270 as illustrated in FIG. 2, and a controller, which can be analogous to the controller 240 as illustrated in FIG. 2. The controller 240 can be coupled to the memory array 271. The controller 240 can be configured to operate the sensing circuitry 270 to move padding bits of a first byte-based memory element stored in the array and move data bits of a second byte-based memory element stored in the array. As a result, a data bit of the first byte-based memory element and one of the data bits of the second byte-based memory element can be stored in physically adjacent memory cells of the memory array 271. The controller 240 can be further configured to operate the sensing circuitry 270 to move the padding bit of the first byte-based memory element and a padding bit of the second byte-based memory element and move data bits of a third byte-based memory element. As a result, a different data bit of the second byte-based memory element and one of the data bits of the third byte-based memory element can be stored in physically adjacent memory cells of the memory array 271. The controller 240 can be configured to operate the sensing circuitry 270 to, after performing the logical operation, move the padding bits and move the data bits such that one of the data bits is aligned with the byte boundary.

The sensing circuitry 270 can include a compute component that is on pitch with a pair of complementary sense lines of the memory array 271. The controller 240 can be configured to operate the compute component to perform a logical operation on the data bits stored in physically adjacent memory cells of the memory array 271.

The controller can cause the process of realigning a memory allocation to be performed without any additional action by the host 210. From the perspective of the host 210, the alignment of the byte-based memory elements is not changed. The controller 240 can cause alignment operations to be performed without input from the OS and/or without the OS being aware of the alignment operations happening internal to the memory. In accordance with the present disclosure, the controller 240, in response to an instruction to perform a logical operation on data that is stored in a plurality of byte-based memory elements, can cause an alignment operation to be performed on the plurality of byte-based memory elements in the memory array 271 such that the data bits of the plurality of byte-based memory elements are stored in physically adjacent memory cells. The controller 240 can cause the logical operation to be performed on the data bits stored in the memory array 271 following the alignment operation. The controller 240 can cause a realignment operation to be performed in the memory array 271 to return the data bits to a byte-based alignment after the logical operation is performed in the memory array 271.

The memory device 278 can be a PIM device. The sensing circuitry 270 can also comprise a compute component, which can be analogous to the compute component 331 as described below with respect to FIG. 3. Example sensing circuitry 270 is described further below. For instance, in a number of embodiments, the sensing circuitry 270 can comprise a number of sense amplifiers and a number of compute components, which may serve as, and be referred to herein as an accumulator, and can be used to perform logical operations (e.g., on data associated with complementary digit lines). In at least one embodiment, storage locations (e.g., latches) corresponding to the compute components can comprise at least a portion of a shift register.

In a number of embodiments, the sensing circuitry 270 can be used to perform logical operations using data stored in the memory array 271 as inputs and store the results of the logical operations back to the memory array 271 without transferring data via a sense line address access (e.g., without firing a column decode signal). As such, various compute functions can be performed using, and within, the sensing circuitry 270 rather than (or in association with) being performed by processing resources external to the sensing circuitry (e.g., by a processor associated with the host 210 and/or other processing circuitry, such as ALU circuitry, located on the memory device 278 (e.g., on controller 240 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, the sensing circuitry 270 is configured to perform logical operations on data stored in the memory array 271 and store the result back to the memory array 271 without enabling an I/O line (e.g., a local I/O line) coupled to the sensing circuitry 270. The sensing circuitry 270 can be formed on pitch with a pair of complementary sense lines of the memory array 271.

As such, in a number of embodiments, circuitry external to the memory array 271 and the sensing circuitry 270 is not needed to perform compute functions as the sensing circuitry 270 can perform the appropriate logical operations to perform such compute functions without the use of an external processing resource. Therefore, the sensing circuitry 270 may be used to compliment and/or to replace, at least to some extent, such an external processing resource (or at least the bandwidth consumption of such an external processing resource).

However, in a number of embodiments, the sensing circuitry 270 may be used to perform logical operations (e.g., to execute instructions) in addition to logical operations performed by an external processing resource, such as the host 210). For instance, the host 210 and/or the sensing circuitry 270 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry 270 can be used to perform logical operations without enabling column decode lines of the array; however, the local I/O line(s) may be enabled in order to transfer a result to a suitable location other than back to the memory array 271 (e.g., to an external register).

Figure 3:
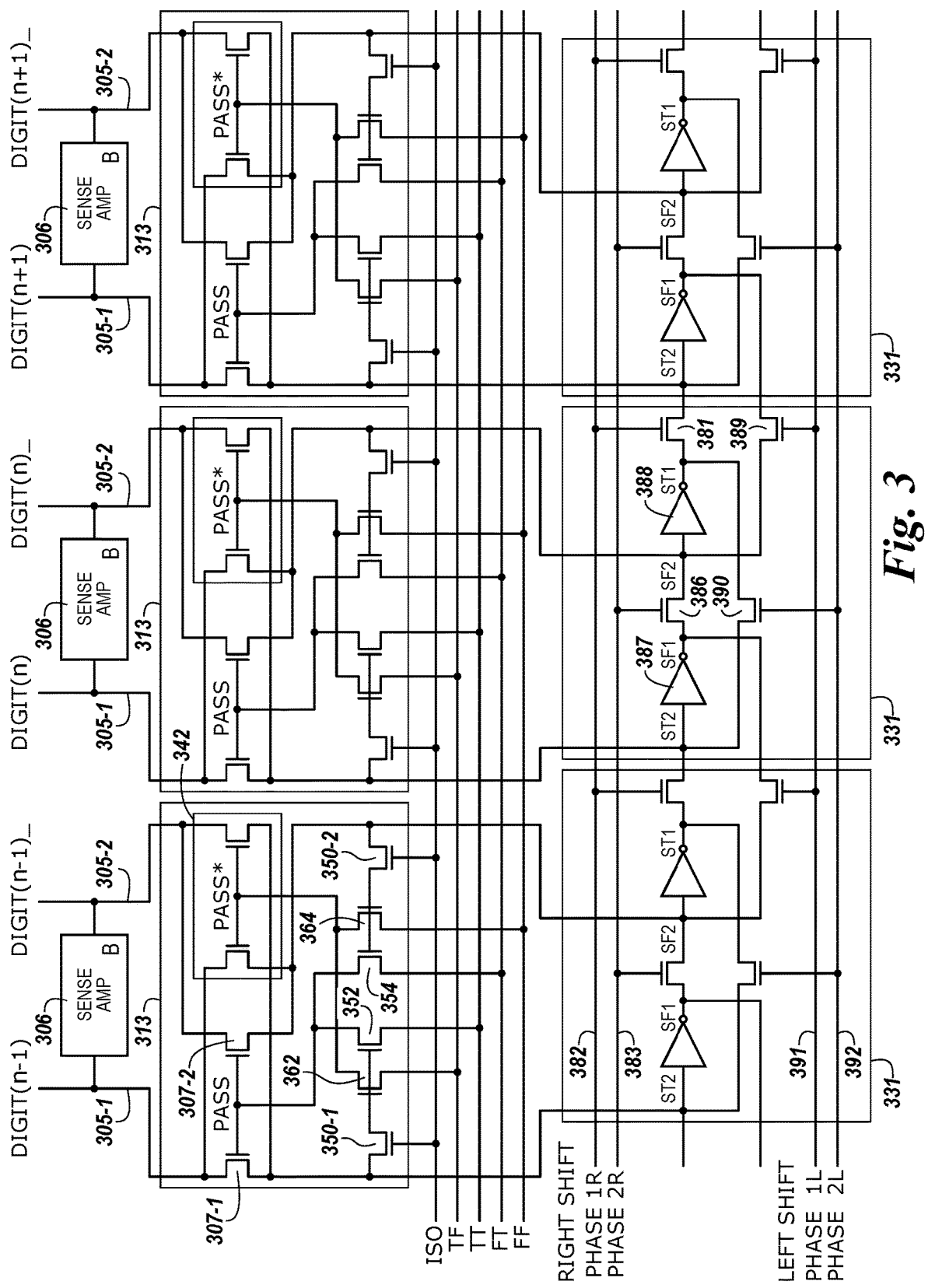
FIG. 3 is a schematic diagram illustrating sensing circuitry having selectable logical operation selection logic in accordance with a number of embodiments of the present disclosure.

FIG. 3 is a schematic diagram illustrating sensing circuitry having selectable logical operation selection logic in accordance with a number of embodiments of the present disclosure. FIG. 3 shows a number of sense amplifiers 306 coupled to respective pairs of complementary sense lines 305-1 and 305-2, and a corresponding number of compute components 331 coupled to the sense amplifiers 306 via pass gates 307-1 and 307-2. The gates of the pass gates 307-1 and 307-2 can be controlled by a logical operation selection logic signal, PASS. For example, an output of the logical operation selection logic 313 can be coupled to the gates of the pass gates 307-1 and 307-2. A compute component 331 can be on pitch with a pair of complementary sense lines 305-1 and 305-2 of the memory array.

According to the embodiment illustrated in FIG. 3, the compute components 331 can comprise respective stages (e.g., shift cells) of a loadable shift register configured to shift data values left and right. According to some embodiments, the compute component 331 can have bidirectional shift capabilities. According to various embodiments of the present disclosure, the compute components 331 can comprise a loadable shift register (e.g., with each compute component 331 serving as a respective shift stage) configured to shift in multiple directions, such as right and left. According to various embodiments of the present disclosure, the compute components 331 can comprise respective stages of a loadable shift register configured to shift in one direction. The loadable shift register can be coupled to the pairs of complementary sense lines 305-1 and 305-2, with node "ST2" of each stage being coupled to the sense line (e.g., DIGIT(n)) communicating a true data value and with node "SF2" of each stage being coupled to the sense line (e.g., DIGIT(n)_) communicating a complementary (e.g., false) data value.

According to some embodiments and as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals "PHASE 1R," "PHASE 2R," "PHASE 1L," and "PHASE 2L" can be applied to respective control lines 382, 383, 391, and 392 to enable/disable feedback on the latches of the corresponding compute components 331 in association with performing logical operations and/or shifting data in accordance with embodiments described herein. Examples of shifting data (e.g., from a particular compute component 331 to an adjacent compute component 331) is described further below with respect to FIG. 4.

A memory cell can be coupled to each of the pairs of complementary sense lines 305-1 and 305-2. The compute component 331 can be configured to perform a logical operation on data values stored in memory cells coupled to the pairs of complementary sense lines 305-1 and 305-2 after an alignment operation has been performed as described with respect to FIGS. 1A-1C.

The compute components 331 of the loadable shift register can comprise a first right-shift transistor 381 having a gate coupled to a first right-shift signal control line "PHASE 1R" 382, and a second right-shift transistor 386 having a gate coupled to a second right-shift signal control line "PHASE 2R" 383. The node "ST2" of each stage of the loadable shift register is coupled to an input of a first inverter 387. The output of the first inverter 387 at node "SF1" is coupled to one source/drain of the second right-shift transistor 386, and another source/drain of the second right-shift transistor 386 is coupled to an input of a second inverter 388 at node "SF2." The output of the second inverter 388 at node "ST1" is coupled to one source/drain of the first right-shift transistor 381, and another source/drain of the first right-shift transistor 381 is coupled to an input of a first inverter at node "ST2" for an adjacent compute component 331.

Sense amplifiers 306 can be coupled to respective pairs of complementary sense lines 305-1 and 305-2, and corresponding compute components 331 coupled to the sense amplifiers 306 via respective pass gates 307-1 and 307-2. The gates of the pass gates 307-1 and 307-2 can be controlled by respective logical operation selection logic signals, "Passd" and "Passdb," which can be output from logical operation selection logic (not shown for clarity).

A first left-shift transistor 389 is coupled between the node "SF2" of one loadable shift register to node "SF1" of a loadable shift register corresponding to an adjacent compute component 331. The channel of second left-shift transistor 390 is coupled from node "ST2" to node "ST1." The gate of the first left-shift transistor 389 is coupled to a first left-shift signal control line "PHASE 1L" 391 and the gate of the second left-shift transistor 390 is coupled to a second left-shift signal control line "PHASE 2L" 392.

Figure 4:
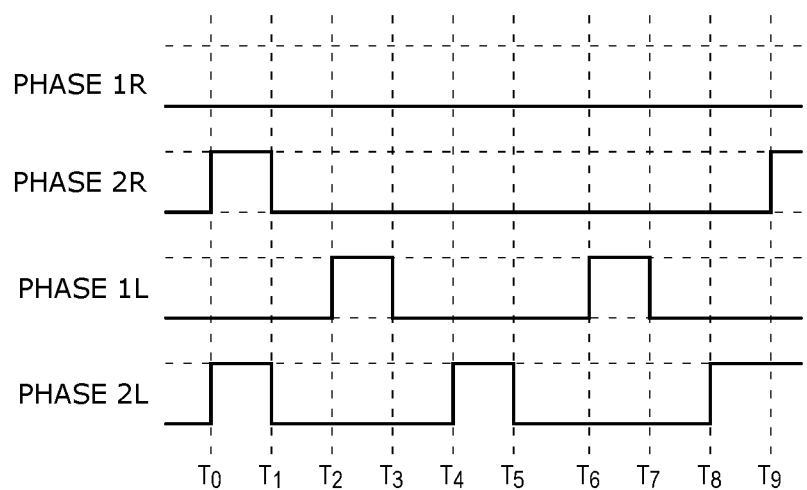
FIG. 4 shows signaling that can be associated with a left shift of data in accordance with a number of embodiments of the present disclosure.

The logical operation selection logic 313 includes the swap gates 342, as well as logic to control the pass gates 307-1 and 307-2 and the swap gates 342. The logical operation selection logic 313 includes four logic selection transistors: logic selection transistor 362 coupled between the gates of the swap transistors 342 and a "TF" signal control line, logic selection transistor 352 coupled between the gates of the pass gates 307-1 and 307-2 and a "TT" signal control line, logic selection transistor 354 coupled between the gates of the pass gates 307-1 and 307-2 and a "FT" signal control line, and logic selection transistor 364 coupled between the gates of the swap transistors 342 and a "FF" signal control line. The gates of logic selection transistors 362 and 352 are coupled to the true sense line through isolation transistor 350-1 (having a gate coupled to an "ISO" signal control line). The gates of logic selection transistors 364 and 354 are coupled to the complementary sense line through isolation transistor 350-2 (also having a gate coupled to an "ISO" signal control line). FIG. 4 illustrates a timing diagram associated with performing shifting operations using the sensing circuitry shown in FIG. 3.

Data values on the respective pairs of complementary sense lines 305-1 and 305-2 can be loaded into the corresponding compute components 331 (e.g., loadable shift register) by causing the pass gates 307-1 and 307-2 to conduct, such as by causing the "Passd" (not shown) control signal to go high. The gates that are controlled to have continuity (e.g., electrical continuity through a channel) are conducting, and can be referred to herein as being OPEN. The gates that are controlled to not have continuity are said to be non-conducting, and can be referred to herein as being CLOSED. For instance, continuity refers to a low resistance condition in which a gate is conducting. The data values can be loaded into the respective compute components 331 by either the sense amplifier 306 overpowering the corresponding compute component 331 (e.g., to overwrite an existing data value in the compute component 331) and/or by disabling the signal control lines "PHASE 1R" 382 and "PHASE 2R" 383. A first latch (e.g., sense amplifier) can be configured to overpower a second latch (e.g., compute component) when the current provided by the first latch and presented to the second latch is sufficient to flip the second latch.

The sense amplifier 306 can be configured to overpower the compute component 331 by driving the voltage on the pair of complementary sense lines 305-1 and 305-2 to the maximum power supply voltage corresponding to a data value (e.g., driving the pair of complementary sense lines 305-1 and 305-2 to the rails), which can change the data value stored in the compute component 331. According to a number of embodiments, the compute component 331 can be configured to communicate a data value to the pair of complementary sense lines 305-1 and 305-2 without driving the voltages of the pair of complementary sense lines 305-1 and 305-2 to the rails. As such, the compute component 331 can be configured to not overpower the sense amplifier 306. For example, the data values on the pair of complementary sense lines 305-1 and 305-2 from the compute component 331 will not change the data values stored in the sense amplifier 306 until the sense amplifier is enabled.

Once a data value is loaded into a compute component 331 of the loadable shift register, the true data value is separated from the complement data value by the first inverter 387. The data value can be shifted to the right (e.g., to an adjacent compute component 331) by alternate operation of the first right-shift transistor 381 and the second right-shift transistor 386, which can be accomplished when the first right-shift signal control line "PHASE 1R" 382 and the second right-shift signal control line "PHASE 2R" 383 have periodic signals that go high out-of-phase from one another (e.g., non-overlapping alternating square waves 180 degrees out of phase with one another). The data value can be latched into a corresponding compute component 331 of the loadable shift register while signal "PHASE 1R" remains low and "PHASE 2R" remains high to maintain the data value latched in the compute component 331.

A rotate operation can be performed on a group of bits, such as a padding bit of a first byte-based memory element and a data bit of a second byte-based memory element. The bits of the first and second byte-based memory elements can be stored in memory cells coupled to the same access line (ROW X) of the memory array. For example, each byte-based memory element can be back-padded and comprise a padding bit and seven data bits. The padding bit can be analogous to the first padding portion 121 of the first byte-based memory element 130 illustrated in FIG. 1. The seven data bits can be analogous to the second data portion 122 of the second byte-based memory element 132 illustrated in FIG. 1.

The rotate operation can include copying the padding bit from a first memory cell in ROW X to a second memory cell that is coupled to a different access line (ROW Y), but coupled to the same sense line (in the same column) as the first memory cell. The padding bit can be copied from the first memory cell to the second memory cell as follows. A signal can be applied to the access line corresponding to ROW X to access (e.g., select) the first memory cell. Then the sense amplifier 306 is enabled, which drives the complementary sense lines 305-1 and 305-2 to the appropriate rail voltages (e.g., $V_{DD}$ and GND) responsive to the padding value stored in the first memory cell. The padding value is then latched in the sense amplifier 306. After the padding bit has been latched in the sense amplifier 306, it can be transferred to the second memory cell by enabling the sense amplifier 306 and applying a signal to the access line corresponding to ROW Y. As described above, a rotate operation can include a copy operation, a shift operation, and a copy-back operation for padding bits. Copying the padding bit from the first memory cell to the second memory cell comprises the first copy operation of a rotate operation.

After copying the padding bit from the first memory cell to the second memory cell, the padding bit can be shifted to the right seven times (corresponding to the seven data bits) and stored back into ROW Y in a third memory cell coupled to a different sense line than the sense line coupled to the first and the second memory cells. Signaling for performing a number of right shifts is described below. Also, after copying the padding bit from the first memory cell to the second memory cell, the seven data bits can be shifted to the left once (corresponding to the one padding bit) within ROW X. Signaling for performing a number of left shifts is described below. After shifting the seven data bits, the padding bit can be copied from the third memory cell in ROW Y to a fourth memory cell in ROW X coupled to the same sense line as the third memory cell (in the same column). Copying the padding bit from the third memory cell to the fourth memory cell comprises the copy-back operation of a rotate operation described above.

FIG. 4 shows signaling that can be associated with a left shift of a bit in accordance with a number of embodiments of the present disclosure. For example, the signaling can be associated with a first left shift of a bit from a compute component 331 to an adjacent compute component 331 as illustrated in FIG. 3. FIG. 4 includes waveforms corresponding to signals that can be applied to the corresponding signal control lines "PHASE 1R" 382, "PHASE 2R" 383, "PHASE 1L" 391, and "PHASE 2L" 392 shown in FIG. 3.

The example shown in FIG. 4 illustrates two left shifts such that a value (e.g., a data bit or a padding bit) stored in a compute component 331 corresponding to column "n" is shifted left to a compute component 331 corresponding to column "n−1." At time $T_0$, the signal control lines "PHASE 2R" 383 and "PHASE 2L" 392 are enabled. Enabling the signal control lines "PHASE 2R" 383 and "PHASE 2L" 392 at time $T_0$ enables feedback on the latch of the compute component 331 such that the value in the compute component 331 is latched therein. As shown at time $T_1$, the signal control lines "PHASE 2R" 383 and "PHASE 2L" 392 are disabled, which disables feedback on the latch of the compute components 331, as described above. The signal control line "PHASE 1L" 391 is then enabled at time $T_2$ and disabled at time T3. Enabling the signal control line "PHASE 1L" 391 causes the first left-shift transistor 389 to conduct, which causes the value from the node "SF1" to move left to the node "SF2." The signal control line "PHASE 2L" 392 is then enabled at time $T_4$ and disabled at time $T_5$. Enabling the signal control line "PHASE 2L" 392 causes the second left-shift transistor 390 to conduct, which causes the value at the node "ST2" to move left to the node "ST1," thereby completing a left shift from the compute component 331 corresponding to column "n" to the compute component 331 corresponding to column "n−1."

The above sequence (e.g., enabling/disabling the signal control line "PHASE 1L" 391 and subsequently enabling/disabling the signal control line "PHASE 2L" 392) can be repeated to achieve a desired number of left shifts. For instance, in this example, a second left shift is performed by enabling the signal control line "PHASE 1L" 391 at time $T_6$ and disabling the signal control line "PHASE 1L" 391 at time $T_7$. The signal control line "PHASE 2L" 392 is subsequently enabled at time $T_8$ to complete the second left shift. Subsequent to the second left shift, the signal control line "PHASE 2L" 392 remains enabled and the signal control line "PHASE 2R" 383 is enabled at time $T_9$ such that feedback is enabled to latch the values in the compute component 331 latches.

Although not shown in FIG. 4, a number of right shifts can be performed. To perform a first right shift, the signal control line "PHASE 1R" 382 is enabled at time $T_2$ and disabled at time $T_3$. Enabling the signal control line "PHASE 1R" 382 causes the first right-shift transistor 381 to conduct, which causes the value at the node "ST1" to move right to the node "ST2" of a right-adjacent compute component 331. The signal control line "PHASE 2R" 382 is subsequently enabled at time $T_4$ and disabled at time $T_5$. Enabling the signal control line "PHASE 2R" 383 causes the second right-shift transistor 386 to conduct, which causes the value from the node "SF1" to move right to the node "SF2" completing a right shift.

The above sequence (e.g., enabling/disabling the signal control line "PHASE 1R" 382 and subsequently enabling/disabling the signal control line "PHASE 2R" 383) can be repeated to achieve a desired number of right shifts. For instance, in this example, a second right shift is performed by enabling the signal control line "PHASE 1R" 382 at time $T_6$ and disabling the signal control line "PHASE 1R" 382 at time $T_7$. The signal control line "PHASE 2R" 383 is subsequently enabled at time $T_8$ to complete the second right shift. Subsequent to the second right shift, the signal control line "PHASE 1R" 382 remains disabled, the signal control line "PHASE 2R" 383 remains enabled, and the signal control line "PHASE 2L" 383 is enabled (e.g., at time $T_9$) such that feedback is enabled to latch the values in the compute component 331 latches.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for memory alignment, comprising:
    translating a logical address for data to a physical address for the data based on:
        a quantity of data bits of each of a plurality of memory elements of the data;
        a quantity of padding bits of each of the plurality of memory elements;
        a quantity of memory elements of the data; and
        a value equivalent to the quantity of padding bits multiplied by the quantity of memory elements; and
    performing a logical operation, via sensing circuitry, on the data at the physical address.

2. The method of claim 1, wherein the method further comprises:
    padding the data with the quantity of padding bits after performing the logical operation; and
    sending the padded data to the host.

3. The method of claim 1, further comprising defining the memory allocation at compile time,
    wherein defining the memory allocation includes receiving a user-defined quantity of data bits in each of the memory elements.

4. The method of claim 3, wherein defining the memory allocation further includes receiving a user-defined length of the memory allocation.

5. The method of claim 1, further comprising storing, according to a non-byte-based alignment, logically adjacent bits in physically adjacent memory cells of the array, wherein the non-byte-based alignment includes:
    at least one padding bit of a first memory element of the plurality of memory elements logically adjacent to at least one padding bit of a second memory element of the plurality of memory elements; and
    at least one data bit of the first memory element logically adjacent to at least one data bit of the second memory element at a location other than a byte boundary.

6. An apparatus, comprising:
    a controller configured to:
        cause a logical address for data of a memory allocation to be translated to a physical address for the data based on:
            a quantity of data bits of each memory element of the memory allocation;
            a quantity of padding bits of each memory elements of the memory allocation; and
            a quantity of memory elements from a start of the memory allocation to the logical address; and
        cause the logical address to be adjusted by a value equivalent to the quantity of padding bits multiplied by the quantity of memory elements from the start of the memory allocation to the logical address.

7. The apparatus of claim 6, wherein the controller is further configured to cause a logical operation to be performed, using sensing circuitry, on the data at the physical address.

8. The apparatus of claim 6, wherein the controller is further configured to, subsequent to performance of the logical operation, cause the data to be padded with the quantity of padding bits.

9. The apparatus of claim 6, wherein the controller is further configured to receive a length of the memory allocation at compile time.

10. The apparatus of claim 9, wherein the length of the memory allocation includes a user-defined quantity of data bits in each memory element of the memory allocation.

11. The apparatus of claim 6, wherein the controller is further configured to receive a user-defined length of the memory allocation at compile time.

12. A non-transitory machine-readable medium storing instructions executable by a processing resource to:
    translate a logical address for data of a first memory element of a memory allocation to a physical address of a memory device at which the data is stored based on:
        a quantity of data bits of the first memory element;
        a quantity of padding bits of the first memory element; and
        a quantity of memory elements from a start of the memory allocation to the logical address; and
    store a plurality of memory elements of the memory allocation according to a non-byte-based alignment, wherein in the non-byte-based alignment at least one data bit of the first memory element and at least one data bit of a second memory element of the memory allocation are logically adjacent at a location of the memory allocation other than a byte boundary and stored in physically adjacent memory cells of the array.

13. The medium of claim 12, further storing instructions executable to perform a logical operation, using sensing circuitry of the memory device, on the data at the physical address.

14. The medium of claim 13, further storing instructions executable to, subsequent to performing the logical operation, pad the data with the quantity of padding bits.

15. The medium of claim 13, further storing instructions executable to, subsequent to performing the logical operation on, perform a realignment operation to return the first and second memory elements to a byte-based alignment.

16. The medium of claim 12, further storing instructions executable to perform a rotate operation on the at least one padding bit of the first memory element and the at least one data bit of the second memory element to perform an alignment operation on the first and second memory elements from a byte-based alignment to the non-byte-based alignment.

17. The medium of claim 16, further storing instructions executable to shift the at least one data bit of the second memory element by a quantity of bits equal to the quantity of padding bits of the first memory element to perform the rotate operation.

18. The medium of claim 12, wherein the instructions executable to store the plurality of memory elements of the memory allocation according to the non-byte-based alignment comprise instructions executable to:
move padding bits of the first memory element such that an alignment of the first and second memory elements is transitioned from a byte-based alignment to the non-byte-based alignment.

19. The medium of claim 12, wherein the instructions executable to store the plurality of memory elements of the memory allocation according to the non-byte-based alignment comprise instructions executable to:
move data bits of the second memory element of the memory allocation such that an alignment of the first and second memory elements is transitioned from a byte-based alignment to the non-byte-based alignment.

20. The medium of claim 19, further storing instructions executable to:
operate sensing circuitry of the memory device to perform a logical operation on the data at the physical address; and
subsequent to performance of the logical operation, operate the sensing circuitry to:
move the padding bits; and
move the data bits such that one of the data bits is aligned with the byte boundary.

* * * * *